United States Patent
Nakagawa

(10) Patent No.: US 8,588,681 B2
(45) Date of Patent: Nov. 19, 2013

(54) SEMICONDUCTOR DEVICE PERFORMING SIGNAL TRANSMISSION BY USING INDUCTOR COUPLING

(75) Inventor: Yoshihiro Nakagawa, Tokyo (JP)

(73) Assignee: NEC Corporation, Tokyo (JP)

( * ) Notice: Subject to any disclaimer, the term of this patent is extended or adjusted under 35 U.S.C. 154(b) by 957 days.

(21) Appl. No.: 12/527,682

(22) PCT Filed: Feb. 20, 2008

(86) PCT No.: PCT/JP2008/052877
§ 371 (c)(1),
(2), (4) Date: Aug. 18, 2009

(87) PCT Pub. No.: WO2008/102814
PCT Pub. Date: Aug. 28, 2008

(65) Prior Publication Data
US 2010/0069000 A1    Mar. 18, 2010

(30) Foreign Application Priority Data

Feb. 23, 2007    (JP) .................. 2007-043561

(51) Int. Cl.
*H04B 5/00* (2006.01)
*H04B 1/06* (2006.01)
*H04B 7/00* (2006.01)
*H04B 1/16* (2006.01)
*G01V 3/00* (2006.01)
*G08C 19/06* (2006.01)
*G08C 19/12* (2006.01)

(52) U.S. Cl.
USPC ....... 455/41.1; 455/252.1; 455/274; 455/341; 340/854.8; 340/870.31

(58) Field of Classification Search
USPC ........................................................ 455/41.1
See application file for complete search history.

(56) References Cited

U.S. PATENT DOCUMENTS

| 6,600,325 | B2* | 7/2003 | Coates et al. ................. 324/519 |
| 7,384,804 | B2* | 6/2008 | Drost et al. ..................... 438/14 |
| 7,994,501 | B2* | 8/2011 | Drost et al. ..................... 257/48 |
| 2003/0065473 | A1* | 4/2003 | Kux et al. ..................... 702/150 |
| 2004/0018654 | A1* | 1/2004 | Drost et al. ..................... 438/17 |
| 2005/0068009 | A1* | 3/2005 | Aoki ............................. 323/205 |
| 2006/0017147 | A1* | 1/2006 | Drost et al. ................... 257/686 |

(Continued)

FOREIGN PATENT DOCUMENTS

| JP | 4-196263 A | 7/1992 |
| JP | H07-79182 A | 3/1995 |

(Continued)

OTHER PUBLICATIONS

International Search Report for PCT/JP2008/052877 mailed Mar. 25, 2008.

(Continued)

*Primary Examiner* — Temesgh Ghebretinsae
*Assistant Examiner* — Devan Sandiford

(57) ABSTRACT

Disclosed is a semiconductor device which performs signal transmission by using inductor coupling. The semiconductor device comprises one or more transmission and reception coil pair, each pair comprising a single transmission coil and a plurality of reception coils, or a plurality of transmission coils and a single reception coil, or a plurality of transmission coils and a plurality of reception coils.

7 Claims, 12 Drawing Sheets

(56) References Cited

U.S. PATENT DOCUMENTS

| | | | |
|---|---|---|---|
| 2007/0077908 A1* | 4/2007 | Vorenkamp et al. | 455/323 |
| 2007/0097725 A1* | 5/2007 | Watanabe | 365/96 |
| 2007/0266557 A1* | 11/2007 | Drost et al. | 29/834 |
| 2007/0289772 A1* | 12/2007 | Kuroda et al. | 174/260 |
| 2008/0070499 A1* | 3/2008 | Wilhelm et al. | 455/41.1 |
| 2008/0136424 A1* | 6/2008 | Chow et al. | 324/662 |
| 2008/0143379 A1* | 6/2008 | Norman | 326/39 |
| 2009/0014892 A1* | 1/2009 | Nakagawa et al. | 257/777 |
| 2009/0176450 A1* | 7/2009 | Chow et al. | 455/41.1 |
| 2009/0279571 A1* | 11/2009 | Chow et al. | 370/479 |

FOREIGN PATENT DOCUMENTS

| | | |
|---|---|---|
| JP | 7-221260 A | 8/1995 |
| JP | 8-236696 A | 9/1996 |
| JP | 11-068033 A | 9/1999 |
| JP | 2000036019 A | 2/2000 |
| JP | 2002026283 A | 1/2002 |
| JP | 2002246250 A | 8/2002 |
| JP | 2005203657 A | 7/2005 |
| JP | 2005228981 A | 8/2005 |

OTHER PUBLICATIONS

K. Takahashi et al., "Current Status of Research and Development for Three-Dimension Chip Stack Technology", Japanese Journal of Applied Physics, vol. 40, Apr. 2001, p. 3032-3037.

K. Kanda et al., "1.27Gb/s/pin 3mW/pin Wireless Superconnect (WSC) Interface Scheme", 2003 IEEE International Solid-State Circuits Conference, 2003.

D. Mizoguchi et al., "A 1.2Gb/s/pin Wireless Superconnect Based on Inductive Inter-Chip Signaling (IIS)", 2004 IEEE International Solid-State Circuits Conference, 2004.

N. Miura et al, "crosstalk Countermeasures for High-Density Inductive-Coupling Channel Array", IEEE Journal of Solid-State Circuits, Feb. 2007, vol. 42,No. 2, 410-421.

N. Miura et al., "A 195-Gb/s 1.2-W Inductive Inter-Chip Wireless-Superconnect With Transmit Power Control Scheme for 3-D-Stacked System in a Package", IEEE Journal of Solid-State Circuits, Jan. 2006, vol.41,No. 1, 23-34.

Japanese Office Action for JP2009-500216 mailed on Dec. 18, 2012.

* cited by examiner

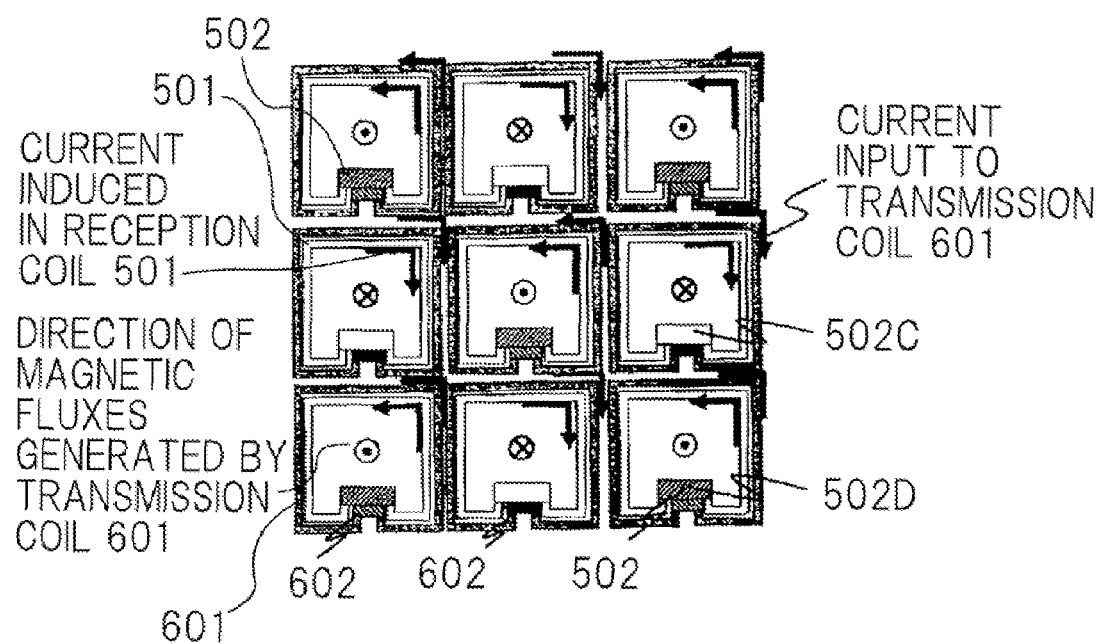

SEMICONDUCTOR DEVICE PERFORMING SIGNAL TRANSMISSION BY USING INDUCTOR COUPLING

The present application is the National Phase of PCT/JP2008/052877, filed Feb. 20, 2008, which claims priority based on Japanese patent application No. 2007-043561 filed on Feb. 23, 2007, and incorporates herein the disclosure thereof by way of reference.

TECHNICAL FIELD

The present invention relates to a semiconductor device, and more particularly to a semiconductor device for transmitting a signal through an electromagnetic coupling provided by an electromagnetic inductance coil (inductive coupling) between chip layers which are stacked in a vertical direction.

BACKGROUND ART

Semiconductor integrated circuits have had their integration density increased by efforts to microfabricate transistor devices which make up the semiconductor integrated circuits. Semiconductor integrated devices on single chips have begun incorporating multifunctionality. Semiconductor memory devices have also had their storage capacity increased regardless of their types, such as DRAM (Dynamic Random Access Memory) and SRAM (Static Random Access Memory), because of microfabricated transistor devices.

In recent years, there have been demands for the development of new technologies for further increasing integration density to achieve multifunctionality and large storage capacity. The first reason for this is that semiconductor chips are more required to have multifunctionality and large storage capacity than transistor devices that are microfabricated to increase multifunctionality and storage capacity, and the second reason is that there are limitations on efforts to microfabricate transistor devices.

One of such new technologies is a layered semiconductor device comprising a plurality of semiconductor chips, which is known as a so-called three-dimensional semiconductor. For example, Patent document 1 discloses an example wherein a memory circuit is integrated in a separate chip stacked on a semiconductor integrated circuit itself, thereby realizing a large-scale integrated circuit without changing the chip area by layering semiconductor chips. Similarly, Patent document 2 discloses a multilayer memory structure comprising memory cell arrays disposed in multiple layers for large storage capacity, thereby realizing a large-scale integrated circuit without changing the size of chip area.

A plurality of semiconductor chips disposed in multiple layers require interconnections between the chips in addition to interconnections in the chips. The interconnections between the chips are mostly in the form connections produced by wire bonding. If wire bonding is applied to layered semiconductors, then wires are bonded to interconnect pads on the surfaces of the chips. However, the wire bonding approach poses some problems. First, the number of wires that can be used is limited because each pad requires a certain pad area of 100 μm squared, for example. Secondly, pads on the surfaces of semiconductor chips need to be mounted on the outer sides of the layered chips so that the pads can be connected from outside of the chips. If identically shaped semiconductor chips are layered, then the bonding wire pads may not be made available.

Generally, two data transmission technologies have been developed to solve the above problems.

The first technology is about through-hole interconnections extending through a semiconductor chip. According to the report from Takahashi, et al (Non-patent document 1), a silicon chip is thinned to 50 μm, and holes of 10 μm squared are formed in the silicon chip. The holes are then filled with metal, providing through-hole interconnections for interconnecting chips. The through-hole interconnections allow interchip interconnections to be arranged in a two-dimensional pattern in the chip plane, making it possible to employ several hundreds interchip interconnections. In addition, since interchip interconnections extend through the chip, it is possible to layer identically shaped semiconductor chips.

The second technology is concerned with the transmission of data between a plurality of semiconductor chips based on the contactless interface technology. The contactless interface technology is roughly classified into a capacitive coupling transmission technology and an inductive coupling transmission technology which employs an inductor. For example, the report from Kanda, et al (Non-patent document 2) introduces a system and a circuit for transmitting data through capacitive couplings. Specifically, pads are provided on a plurality of semiconductor chips at intervals of 40 μm, and the semiconductor chips are layered face to face, providing capacitive couplings between the pads. The report from Mizoguchi, et al (Non-patent document 3) introduces a system and a circuit for transmitting data through inductive couplings. Specifically, coils in the form of spiral inductors are formed in semiconductor interconnection areas on semiconductor chips at intervals of 100 μm, and the semiconductor chips are layered face to back, thereby providing inductive couplings.

If a plurality of semiconductor chips are layered using the technologies of through-hole interconnections, capacitive couplings, and inductive couplings, then it is possible to layer logic circuits and analog circuits as well as memory circuits mentioned in the examples above, for thereby achieving multifunctionality in addition to large storage capacity.

The through-hole interconnection technology needs the step of forming holes called through vias in the semiconductor substrate of a semiconductor chip for connecting the face and back of the semiconductor chip for data transmission and for forming an interconnection of an electrically conductive material such as metal in the through via, and the step of applying an insulating material to insulate the through interconnection from the semiconductor substrate. Therefore, the semiconductor fabrication process is complex or is highly costly and time-consuming. On the other hand, the capacitive coupling technology requires that the chips be layered face to face because capacitive couplings are formed between the facing pads on the surfaces of the chips. As a result, the chips that can be layered are limited to two layers, and there are limitations on the layering of three or more chips and on efforts to achieve multifunctionality and larger storage capacity.

Consequently, contactless interface technology based on inductive coupling is highly likely as a technology for layering three or more chips to contribute to making semiconductor devices with multifunctionality and larger storage capacity.

Contactless interface technology based on inductive coupling will briefly be described below. FIG. 1 is a block diagram of a structural example of a combined transmitting and receiving section according to the background art for sending and receiving data between chips. It is assumed that one bit of data is sent from one chip to another chip. It is also assumed that the polarity of data indicated by a signal voltage is "0" if the signal voltage has a ground potential and "1" if the signal voltage has a given potential which is determined as a voltage that is different from the ground potential.

As shown in FIG. 1, the transmitting section including chip 701 for transmitting data incorporates transmission coil 703 and transmitter 702. Transmitter 702 includes a variable-current-direction current source therein, and has a current direction variable depending on transmission data 704 input to a data input terminal. The current direction is positive when the current flows across transmission coil 703 from the left to the right in FIG. 1, and is negative when the current flows in the opposite direction. It is assumed hereinafter that if the coil is plotted horizontally, then the current direction is positive when the current flows from the left to the right and is negative when the current flows in the opposite direction, and if the coil is plotted vertically, then the current direction is positive when the current flows downwardly and is negative when the current flows in the opposite direction. The receiving section including chip 706 for receiving data incorporates reception coil 707 and receiver 708 connected across reception coil 707. Receiver 708 reads a current change developed in reception coil 707. Chip 701 and chip 706 are layered such that transmission coil 703 and reception coil 707 are in essentially superposed positions in a direction perpendicular to the chip planes.

When the polarity of transmission data 704 input to the data input terminal is "1", the variable-current-direction current source supplies a current in the positive direction to transmission coil 703 in synchronism with transmission clock 705. When the current flows through transmission coil 703, transmission coil 703 generates a magnetic field due to the electromagnetic induction, causing reception coil 707 to induce a current. Receiver 708 reads a current change developed in reception coil 707. Similarly, when the polarity of transmission data 704 is "0", reception coil 707 induces a current whose direction depends on the direction of the current flowing through transmission coil 703, and receiver 708 reads the induced current. Since the direction of the current induced in reception coil 707 is different depending on transmission data 704, reception data 709 output from the data output terminal corresponds to the polarity of transmission data 704. Accordingly, data can be transmitted between a plurality of layered chips even though interconnections are not provided between the chips for data transmission.

FIG. 2 shows a timing chart for signal transmission through the inductive coupling shown in FIG. 1, FIG. 3 shows a circuit diagram of an example of a transmission circuit, and FIG. 4 shows a circuit diagram of an example of a reception circuit.

According to the above signal transmission scheme, a current is supplied to a transmission coil fabricated on a chip to induce an electric signal in a reception coil that is fabricated on another chip which is separate from the chip with the transmission coil thereon, and the signal is observed, thereby transmitting the signal. In order to transmit a signal at a high rate and with a high quality such as a low error rate according to this transmission scheme, the signal induced in the reception coil has to be large enough to achieve a desired S/N ratio. The signal induced in the reception coil is proportional to the mutual inductance between the transmission and reception coils. The mutual inductance is proportional to the self-inductance of the reception coil, the self-inductance transmission coil, and the coupling coefficient between the coils. Since the coupling coefficient depends on the relative positions of the coils, the positions of the electromagnetic induction coils on the chips need to be adjusted with extremely high accuracy for realizing high-quality signal transmission.

If the coils are displaced out of position, then the mutual inductance decreases, resulting in a reduction in signal intensity. According to the above relevant art, it is very difficult to mount the chips while they are kept in highly accurate relative positions. Even if the chips can be mounted highly accurately, the packaging cost is increased. Furthermore, since the coil positions cannot be changed once the chips have been mounted in position, the transmission rate is limited, and the error rate cannot be sufficiently lowered.

The wire bonding which has been used in the layering SIP technology so far has made it possible to layer general-purpose chips because connecting positions can be changed to a certain extent. However, signal transmitting apparatus according to the background art which have used inductive couplings have been required to use chips having a dedicated design or chips having transmission and reception coils positionally aligned with each other for the reason that the transmission and reception coils have to be positionally aligned highly accurately with each other. Therefore, the manufacturing cost of the signal transmitting apparatus has been high.

Furthermore, device characteristic variations caused when semiconductor devices are manufactured make it impossible to sufficiently lower the error rate in signal transmission. For example, if there are characteristic variations between the transistors of the receiver, then they make the receiver behave as if an offset has been added to the input signal, tending to lead to an erroneous transmission of the signal.

Heretofore, the signal is received using only an induced current generated by the magnetic fluxes that pass through the reception coil which is mounted directly below the transmission coil. Accordingly, any magnetic fluxes that spread away from the magnetic fluxes that are directed directly below the transmission coil and pass through the reception coil are wasted. The current flowing through the transmission coil has been increased by an amount which is commensurate with the wasted magnetic fluxes, for transmitting the signal. As a consequence, the transmission power is increased, resulting in an increase in the consumption of power.

Patent document 1: JP4-196263A
Patent document 2: JP2002-26283A
Non-patent document 1: K. Takahashi et al., Japanese Journal of Applied Physics, 40, 3032 (2001)
Non-patent document 2: K. Kanda, et al., International Solid-State Circuits Conference, 2003
Non-patent document 3: D. Mizoguchi, et al., International Solid-State Circuits Conference, 2004

DISCLOSURE OF THE INVENTION

It is an object of the present invention to provide a semiconductor device which reduces the effect of characteristic variations caused when semiconductor devices are manufactured, does not require highly accurate positioning control, and is capable of performing high-quality signal transmission.

Another object of the present invention is to provide a semiconductor device which efficiently receives a signal generated by a transmission coil for reducing the consumption of power.

Means for Solving the Problems

According to a first aspect of the present invention, at least one transmission and reception coil pair comprising a single transmission coil and a plurality of reception coils is provided.

According to a second aspect of the present invention, at least one transmission and reception coil pair comprising a plurality of transmission coils and a single reception coil is provided.

According to a third aspect of the present invention, which is a combination of the first aspect and the second aspect, at least one transmission and reception coil pair comprising a plurality of transmission coils and a plurality of reception coils is provided.

According to the present invention, the processing process of an arithmetic device of signal receivers, or the signals of a transmission signal generator of signal transmitters, or both are controlled after they are mounted on chips, to remove the effect of positional displacements caused when they are mounted on the chips, the effect of offsets due to variations caused when the semiconductor device is manufactured, and the effect of disturbances, to thereby perform high-quality signal transmission.

Since the signals transmitted by the transmitters can effectively be utilized, the transmission power of the semiconductor device can be reduced, and the transmission distance can also be increased.

BRIEF DESCRIPTION OF THE DRAWINGS

FIG. 21 is a diagram showing the manner in which the third exemplary embodiment operates when transmission data are "0".

Figure 1:
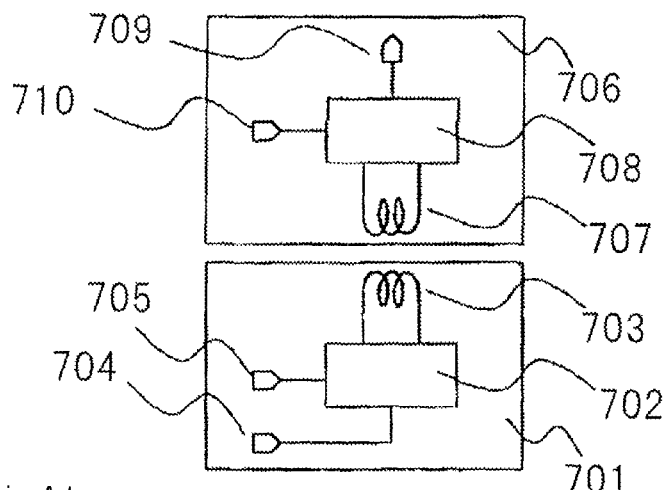
FIG. 1 is a block diagram of a structural example of a combined transmitting and receiving section according to a related art for sending and receiving data between chips.
Figure 2:
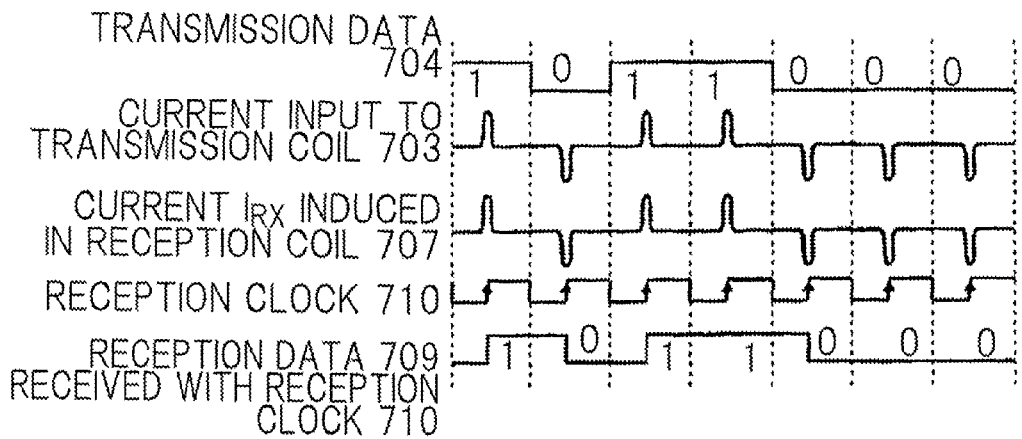
FIG. 2 a timing chart for signal transmission through an inductive coupling shown in FIG. 1.
Figure 3:
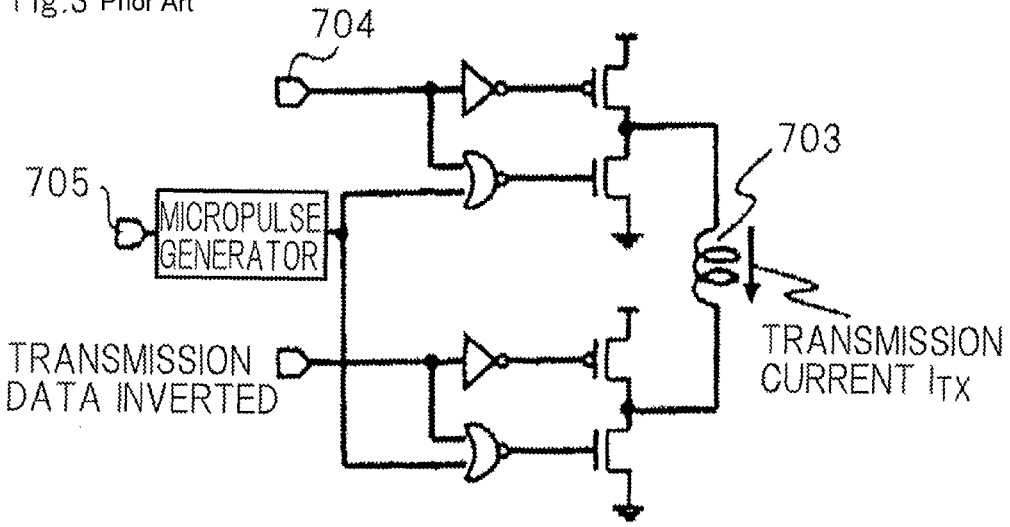
FIG. 3 is a circuit diagram of a circuit example of a transmitting section shown in FIG. 1.
Figure 4:
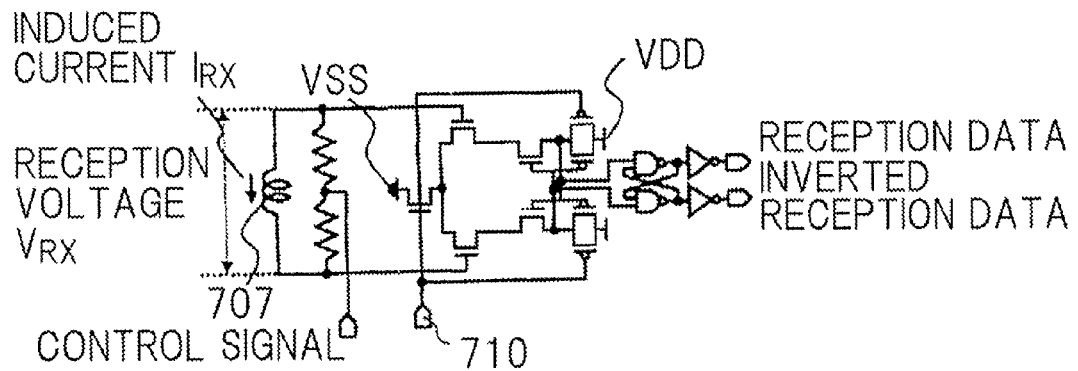
FIG. 4 is a circuit diagram of a circuit example of a receiving section shown in FIG. 1.

DESCRIPTION OF REFERENCE CHARACTERS 101 reception coil
101-1 through 101-5 reception coil group
101A reception coil inside of transmission coil 201
101B reception coil outside of transmission coil 201
102 signal receiver
102A signal receiver in phase with transmission signal
102B signal receiver in opposite phase with transmission signal
102C signal receiver which is in normal operation
102D signal receiver which is malfunctioning
102E signal receiver which has changed in polarity
102F signal receiver which does not receive data
103 reception mechanism
104 reader
105, 105-1 through 105-3 arithmetic devices
106 read control signal
107, 107-1 through 107-3 reception data
108 reception signal
109 selector
110 selection signal
201, 201-1 through 201-3 transmission coil
202 signal transmitter
301 transmission coil
301A transmission coil inside of reception coil 401
301B transmission coil outside of reception coil 401
302 signal transmitter
302A signal receiver which is in normal operation
302B signal receiver which is malfunctioning
303 transmission mechanism
304 writer
305 transmission signal generator
306 write control signal
307 transmission data
401 reception coil
402 signal receiver
501 reception coil
502 signal receiver
502A, 502D signal receiver which outputs "1"
502B, 502C signal receiver which outputs "−1"
503 reception mechanism
504 reader
505 arithmetic device
506 read control signal 601 transmission coil
602 signal transmitter
603 transmission mechanism
604 writer
605 transmission signal generator
606 write control signal
607 transmission data
608 transmission signal

BEST MODE FOR CARRYING OUT THE INVENTION

1st Exemplary Embodiment

Figure 5:
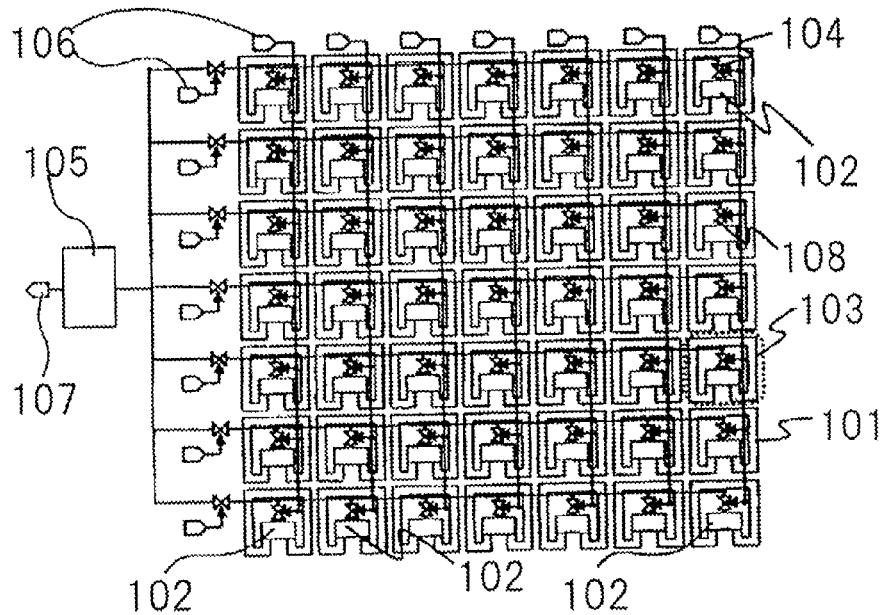
FIG. 5 is a block diagram of a receiving section of a semiconductor device according to a first exemplary embodiment of the present invention.

FIG. 5 is a block diagram of a receiving section of a semiconductor device according to a first exemplary embodiment of the present invention, i.e., a semiconductor device having a transmission and reception coil pair comprising a single transmission coil and a plurality of reception coils.

The receiving section includes a plurality of reception mechanisms 103 in an array of seven rows×seven columns, each of reception mechanisms 103 comprising reception coil 101 and signal receiver 102. Signals received by reception mechanisms 103 are sent from readers 104 that are controlled by read control signals 106 to arithmetic device 105, which process the received signals into reception data 107. It is assumed that signal receiver 102 at the mth×nth location in FIG. 5 is referred to as R(m,n) and output signal 108 from R(m,n) is referred to as D(m,n) where m represents an mth row and n represents an nth column, each of m, n being an integer of 0 or greater than 0. In FIG. 1, each of m, n is in the range from 0 to 6. In FIG. 5, reception mechanisms 103 are arranged in a 7×7 array. However, reception mechanisms 103 are not required to be in a 7×7 array, but may be in any array insofar as they are plural.

Figure 6:
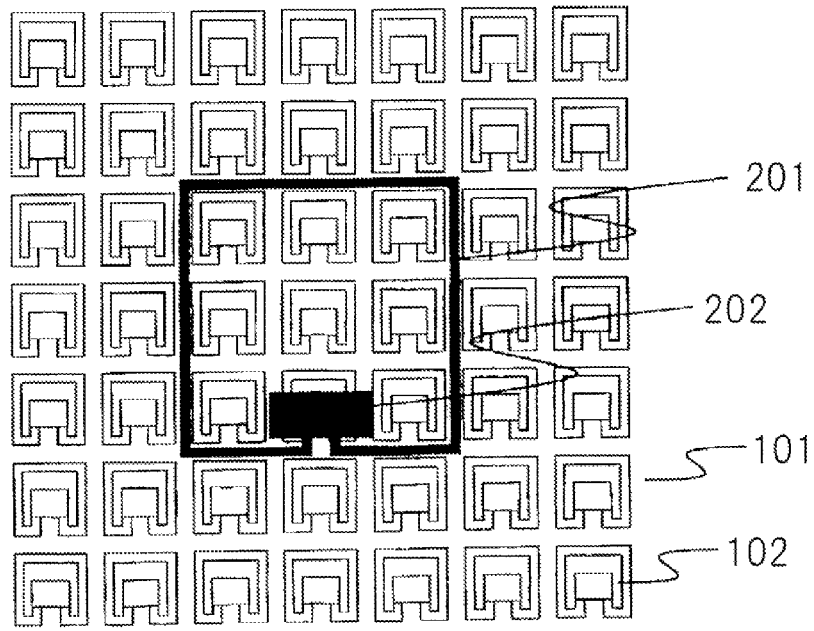
FIG. 6 is a schematic plan view which is clearly indicative of the relative positional relationship between a transmission coil and reception coils according to the first exemplary embodiment.

FIG. 6 is a schematic plan view which is clearly indicative of the relative positional relationship between a transmission coil and reception coils. In FIG. 6, transmission coil 201 mounted on a chip is projected onto a chip on which reception coils 101 are disposed. If the diameter of reception coils 101 is greater than the diameter of transmission coil 201, then magnetic fluxes having different directions pass through reception coils 201 and cancel each other out. Therefore, as shown in FIG. 6, the diameter of reception coils 101 should be the same as or smaller than the diameter of transmission coil 201 for better efficiency.

Operation of the semiconductor device at the time when a current is supplied to transmission coil 201 for signal transmission will be described below. It is assumed that a current which flows clockwise in the drawings as viewed from above is represented by "1", and a current which flows counterclockwise is represented by "−1". The same reference characters will subsequently be used.

Figure 7:
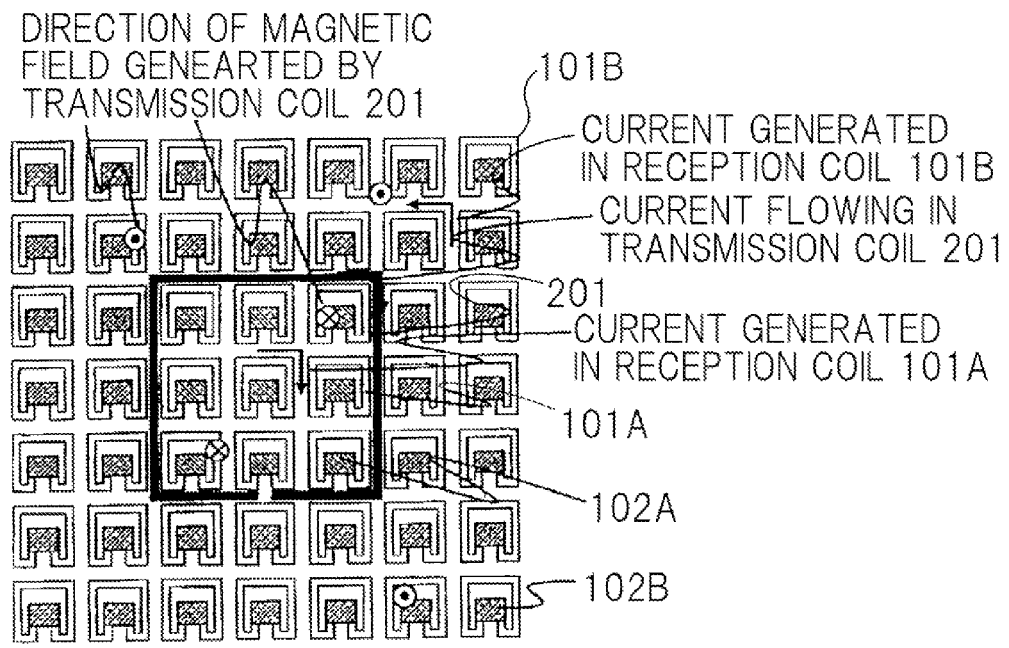
FIG. 7 is a diagram showing a current flowing through a reception coil when a signal is input to cause a current to flow clockwise in a transmission coil, i.e., when transmission data are of "1", according to the first exemplary embodiment.

FIG. 7 shows a current flowing through reception coils 101 when a signal is input to cause a current to flow clockwise through transmission coil 201, i.e., when transmission data are "1". As shown in FIG. 7, those reception coils 101A which are located inside of transmission coil 201 have currents flowing therethrough in a clockwise direction which is the same as the current flowing through transmission coil 201, and those reception coils 101B which are located outside of transmission coil 201 have currents flowing therethrough in a counterclockwise direction which is opposite to the current flowing through transmission coil 201.

Figure 8:
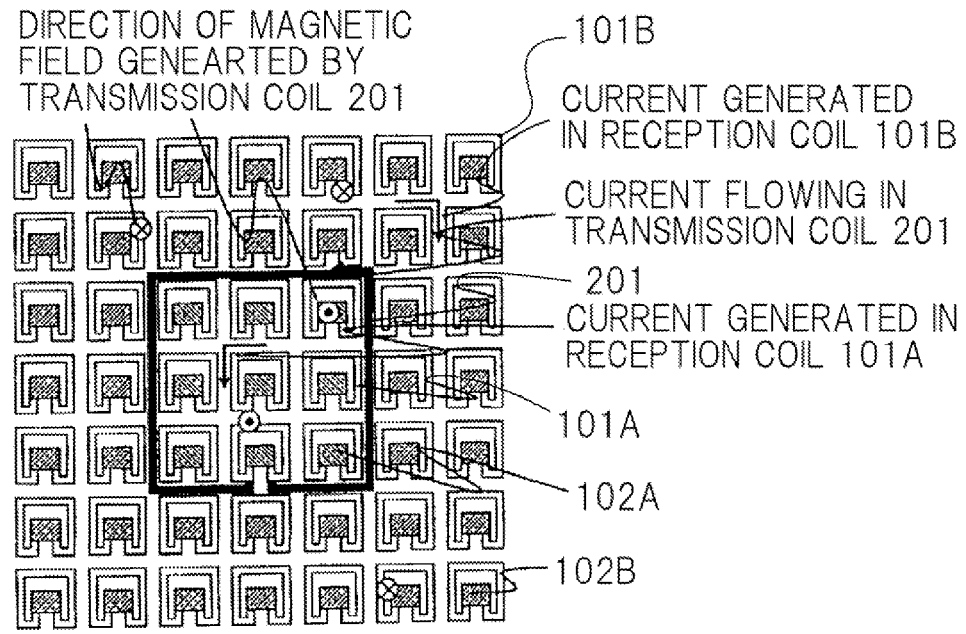
FIG. 8 is a diagram showing a current flowing through a reception coil when a signal is input to cause a current to flow counterclockwise in a transmission coil, i.e., when transmission data are "0", according to the first exemplary embodiment.

When a current is caused to flow counterclockwise through transmission coil 201, i.e., when transmission data are "1", as shown in FIG. 8, those reception coils 101A which are located inside of transmission coil 201 have currents flowing therethrough in a counterclockwise direction which is the same as the current flowing through transmission coil 201, and those reception coils 101B which are located outside of transmission coil 201 have currents flowing therethrough in a clockwise direction which is opposite to the current flowing through transmission coil 201. In FIGS. 7 and 8, signal receivers 102A are in phase with the transmission signal, and signal receivers 102B are in opposite phase with the transmission signal.

Signal receivers R(m,n) have a function to observe currents flowing through reception coils 101 and change the output signal depending on the polarity and intensity of the currents. Table 1 shows a list of reception signals D(m,n) output from respective signal receivers R(m,n) at the time when transmission data "1", "0" are transmitted, as shown in FIGS. 7 and 8. Reception signals D(m,n) are binary digital signals that have been converted from the induced currents generated in reception coils 101 by signal receivers R(m,n) which are connected to respective reception coils 101.

TABLE 1

| | | m | | | | | | |
|---|---|---|---|---|---|---|---|---|
| | | 0 | 1 | 2 | 3 | 4 | 5 | 6 |
| Reception signals D(m, n) when "1" is transmitted: | | | | | | | | |
| n | 6 | −1 | −1 | −1 | −1 | −1 | −1 | −1 |
| | 5 | −1 | −1 | −1 | −1 | −1 | −1 | −1 |
| | 4 | −1 | −1 | 1 | 1 | 1 | −1 | −1 |
| | 3 | −1 | −1 | 1 | 1 | 1 | −1 | −1 |
| | 2 | −1 | −1 | 1 | 1 | 1 | −1 | −1 |
| | 1 | −1 | −1 | −1 | −1 | −1 | −1 | −1 |
| | 0 | −1 | −1 | −1 | −1 | −1 | −1 | −1 |
| Reception signals D(m, n) when "0" is transmitted: | | | | | | | | |
| n | 6 | 1 | 1 | 1 | 1 | 1 | 1 | 1 |
| | 5 | 1 | 1 | 1 | 1 | 1 | 1 | 1 |
| | 4 | 1 | 1 | −1 | −1 | −1 | 1 | 1 |
| | 3 | 1 | 1 | −1 | −1 | −1 | 1 | 1 |
| | 2 | 1 | 1 | −1 | −1 | −1 | 1 | 1 |
| | 1 | 1 | 1 | 1 | 1 | 1 | 1 | 1 |
| | 0 | 1 | 1 | 1 | 1 | 1 | 1 | −1 |

After the signal has been received, reception signals D(m, n) are successively input to arithmetic device 105 by read control signals 106. Arithmetic device 105 processes reception signals D(m,n) depending on the positions of respective signal receivers R(m,n). Specifically, arithmetic device 105 multiplies reception signals D(m,n) from signal receivers R(m,n) whose reception coils 101 are located inside of transmission coil 201, by A(m,n)=1, and adds the products together, and multiplies reception signals D(m,n) from signal receivers R(m,n) whose reception coils 101 are located outside of transmission coil 201, by A(m,n)=−1, and adds the products together. Table 2 shows a list of A(m,n).

TABLE 2

| | | m | | | | | | |
|---|---|---|---|---|---|---|---|---|
| | | 0 | 1 | 2 | 3 | 4 | 5 | 6 |
| n | 6 | −1 | −1 | −1 | −1 | −1 | −1 | −1 |
| | 5 | −1 | −1 | −1 | −1 | −1 | −1 | −1 |
| | 4 | −1 | −1 | 1 | 1 | 1 | −1 | −1 |
| | 3 | −1 | −1 | 1 | 1 | 1 | −1 | −1 |
| | 2 | −1 | −1 | 1 | 1 | 1 | −1 | −1 |
| | 1 | −1 | −1 | −1 | −1 | −1 | −1 | −1 |
| | 0 | −1 | −1 | −1 | −1 | −1 | −1 | −1 |

Based on Table 1 and Table 2, the sum produced by arithmetic device 105 is given as 49 when "1" is transmitted, and as −49 when "0" is transmitted. The sums are processed by a threshold process to recover the transmission signal. In this manner, the signal transmission is realized.

The threshold value used in the threshold process may be set to any arbitrary value. Coefficient A(m,n) applied to signal receivers R(m,n) is either 1 or −1. However, coefficient A(m, n) is not limited to those values, but may have an intermediate value between 1 and −1 or any arbitrary value whose absolute value is in excess of 1. The arbitrary value may be set to magnitudes for respective signal receivers R(m,n). The purpose for using coefficient A(m,n) is to arbitrarily control the degree by which signal receivers R(m,n) contribute to the output signal from arithmetic device 105.

In the above example, coefficient A(m,n) is changed to arbitrarily control the degree by which signal receivers R(m, n) contribute to the output signal from arithmetic device 105. However, the degree by which signal receivers R(m,n) contribute to the output signal from arithmetic device 105 may be controlled by changing the threshold value and signal amplification factor of signal receivers R(m,n) to produce reception signals D(m,n).

Figure 9:
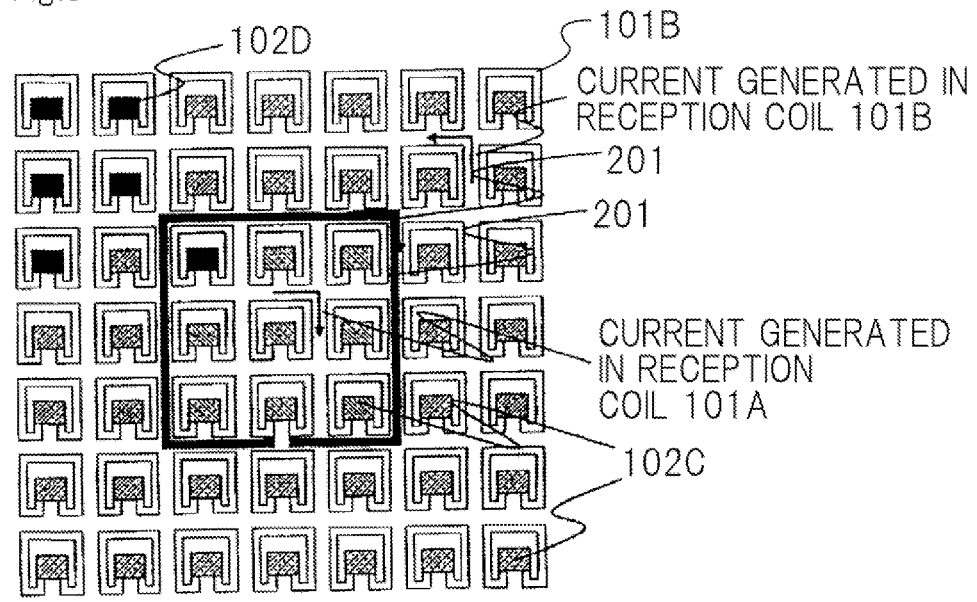
FIG. 9 is a diagram showing a current flowing through a reception coil when a signal receiver malfunctions.

According to the related art, a signal is received by using only an induced current which is generated by magnetic fluxes that pass through reception coil 101 mounted immediately below transmission coil 201. Accordingly, any magnetic fluxes that spread away from the magnetic fluxes that are directed immediately below transmission coil 201 and that pass through reception coil 101 are wasted. According to the present invention, however, as shown in FIGS. 7 and 8, reception coils 101 are disposed not only directly below, but also around transmission coil 201. Consequently, signals can be received efficiently, and the current flowing through transmission coil 201 can be reduced, so that power consumption can be reduced. As shown in FIG. 9, even when some of signal receivers 102 are caused to malfunction due to disturbances or fluctuations, signal transmission is possible provided that there are more signal receivers 102C which can receive signals accurately than there are signal receivers 102D that malfunction.

Table 3 shows a list of reception signals D(m,n) at the time when "1" is transmitted and when signal receivers 102 are malfunctioning.

TABLE 3

|   |   | m |   |   |   |   |   |   |
|---|---|---|---|---|---|---|---|---|
|   |   | 0 | 1 | 2 | 3 | 4 | 5 | 6 |
| n | 6 | 1 | 1 | −1 | −1 | −1 | −1 | −1 |
|   | 5 | 1 | 1 | −1 | −1 | −1 | −1 | −1 |
|   | 4 | 1 | −1 | −1 | 1 | 1 | −1 | −1 |
|   | 3 | −1 | −1 | 1 | 1 | 1 | −1 | −1 |
|   | 2 | −1 | −1 | 1 | 1 | 1 | −1 | −1 |
|   | 1 | −1 | −1 | −1 | −1 | −1 | −1 | −1 |
|   | 0 | −1 | −1 | −1 | −1 | −1 | −1 | −1 |

The sum produced by arithmetic device 105 is given as 37. If the sum is in excess of a threshold value, then the transmission signal can be recovered without an error, so that the signal transmission can be realized. If these signal receivers 102 malfunction at all times, then the signals from erroneously receiving signal receivers 102 are ignored in the arithmetic operation, making it possible to prevent the overall signal transmitter from erroneously receiving the signal. Table 4 shows a list of coefficients A(m,n) to be used for such signal processing.

TABLE 4

|   |   | m |   |   |   |   |   |   |
|---|---|---|---|---|---|---|---|---|
|   |   | 0 | 1 | 2 | 3 | 4 | 5 | 6 |
| n | 6 | 0 | 0 | −1 | −1 | −1 | −1 | −1 |
|   | 5 | 0 | 0 | −1 | −1 | −1 | −1 | −1 |
|   | 4 | 0 | −1 | 0 | 1 | 1 | −1 | −1 |
|   | 3 | −1 | −1 | 1 | 1 | 1 | −1 | −1 |
|   | 2 | −1 | −1 | 1 | 1 | 1 | −1 | −1 |
|   | 1 | −1 | −1 | −1 | −1 | −1 | −1 | −1 |
|   | 0 | −1 | −1 | −1 | −1 | −1 | −1 | −1 |

Using coefficients A(m,n) shown in Table 4, the sum produced by arithmetic device 105 is given as 43, making it possible to perform more reliable signal transmission.

Figure 10:
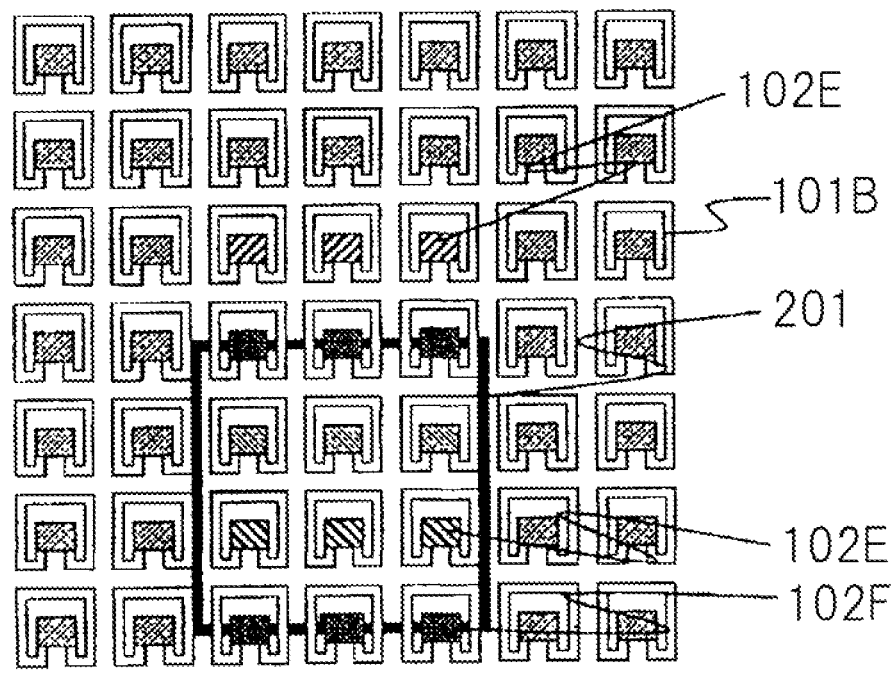
FIG. 10 is a diagram showing the manner in which a chip is displaced out of position when it is mounted according to the first exemplary embodiment.

Now, as shown in FIG. 10, it is assumed that transmission coil 201 and reception coils 101 have their relative positions displaced when they are mounted on respective chips. In FIG. 10, transmission coil 201 is shown as being displaced slightly downwardly from the state shown in FIG. 6 which is free of positional displacements. Some of reception coils 101, which are located inside of transmission coil 201 in the state shown in FIG. 6, which is free of positional displacements, are located outside of transmission coil 201. This positional displacement changes the polarities of reception signals, preventing signals from being received accurately. The arithmetic operations for processing reception signals, whose polarity has changed, from signal receivers 102E are changed from addition to subtraction or from subtraction to addition. Those reception coils 101 which are positioned substantially on the boundaries of transmission coil 201 have magnetic fields of different directions passing therethrough. The total amount of magnetic fields acting on those reception coils 101 is reduced, tending to cause those reception coils 101 to receive the signal in error. The reception signals from signal receivers 102F of those reception coils 101 are neither added nor subtracted, and hence signal receivers 102F are made insensitive to the signal reception. In this manner, it is possible to perform high-quality signal transmission. Even if positional displacements occur when the coils are mounted on the chips, therefore, the adverse effects of the positional displacements can be reduced by controlling the arithmetic operations.

Table 5 shows coefficients A(m,n) to be used if positional displacements occur when the coils are mounted on the chips.

TABLE 5

|   |   | m |   |   |   |   |   |   |
|---|---|---|---|---|---|---|---|---|
|   |   | 0 | 1 | 2 | 3 | 4 | 5 | 6 |
| n | 6 | −1 | −1 | −1 | −1 | −1 | −1 | −1 |
|   | 5 | −1 | −1 | −1 | −1 | −1 | −1 | −1 |
|   | 4 | −1 | −1 | 0 | 0 | 0 | −1 | −1 |
|   | 3 | −1 | −1 | 1 | 1 | 1 | −1 | −1 |
|   | 2 | −1 | −1 | 1 | 1 | 1 | −1 | −1 |
|   | 1 | −1 | −1 | 1 | 1 | 1 | −1 | −1 |
|   | 0 | −1 | −1 | 0 | 0 | 0 | −1 | −1 |

Using coefficients A(m,n) shown in Table 5, the sum produced by arithmetic device 105 is given as 43, making it possible to perform signal transmission even if positional displacements occur.

Processes of setting coefficients A(m,n) will be described by way of example below.

Positional displacements of coils mounted on chips may be mechanically measured, and optimum coefficients may be determined from the positional displacements. Alternatively, transmission data of known values may be transmitted, and coefficients A(m,n) may be determined by changing them to minimize any errors of the received results.

While the characteristics including the sensitivities and signal amplification factors of signal receivers 102 are regarded as constant, the characteristics of signal receivers 102 may be changed based on the positional displacements to achieve the same effects as when coefficients A(m,n) are changed.

Reception signals D(m,n) have so far been handled as digital data "1", "−1". However, reception signals D(m,n) may not be converted into digital data, but may be processed as analog data.

Errors of signal reception caused by biased characteristics due to device variations of signal receivers 102 can be reduced by changing coefficients A(m,n) described above. For example, if signal receiver R(m,n), which outputs "1" at all times due to a device variation, is manufactured, then the effect of malfunctioning signal receiver R(m,n) will not be reflected in the reception data by setting above coefficients A(m,n) to "0". If the other signal receivers are operating normally at this time, then it is possible to receive the signal accurately.

Although signals D(m,n)×A(m,n) are shown so far as having been sent to arithmetic device 105, signals B(m,n) may be added thereto, so that signals D(m,n)×A(m,n)+B(m,n) may be sent to remove an offset due to variations.

Likewise, signal receivers that are highly vulnerable to disturbances can similarly be coped with. If a certain signal receiver tends to erroneously receive a signal due to an adjacent coil, then coefficient A(m,n) corresponding to the signal receiver may be set to "0" to prevent the output signal from the signal receiver, which is malfunctioning due to the adjacent coil, from being reflected in the final reception data. Therefore, it is possible to receive the signal accurately.

A semiconductor device incorporating a plurality of transmission and reception coil pairs according to the first exemplary embodiment will be described by way of example below.

Figure 11:
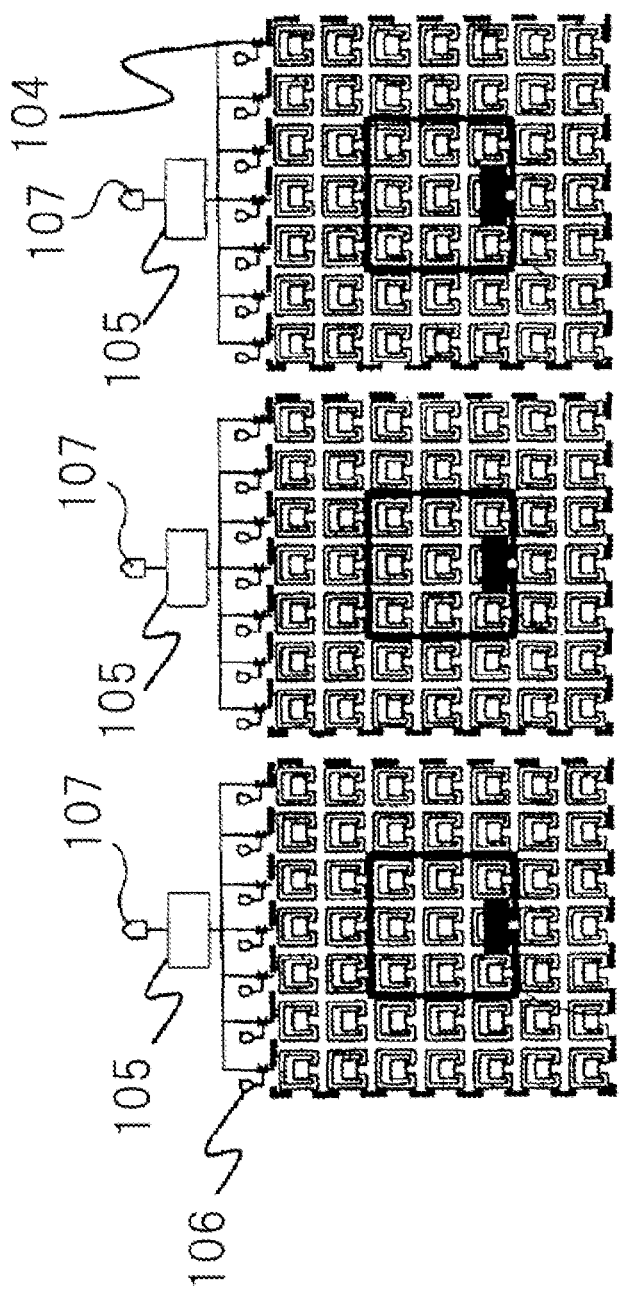
FIG. 11 is a diagram showing an example of a semiconductor device having a plurality of mounted pairs of transmission and reception coils according to the first exemplary embodiment.

FIG. 11 is a block diagram of an example of a semiconductor device incorporating three mounted transmission and reception coil pairs. The transmission and reception coil pairs have three receiving sections each shown in FIG. 5. In FIG. 11, readers 104 are partly omitted from illustration. Transmission coils are shown as being projected to clearly indicate the relative positions of the transmission coils and the reception coils.

Figure 12:
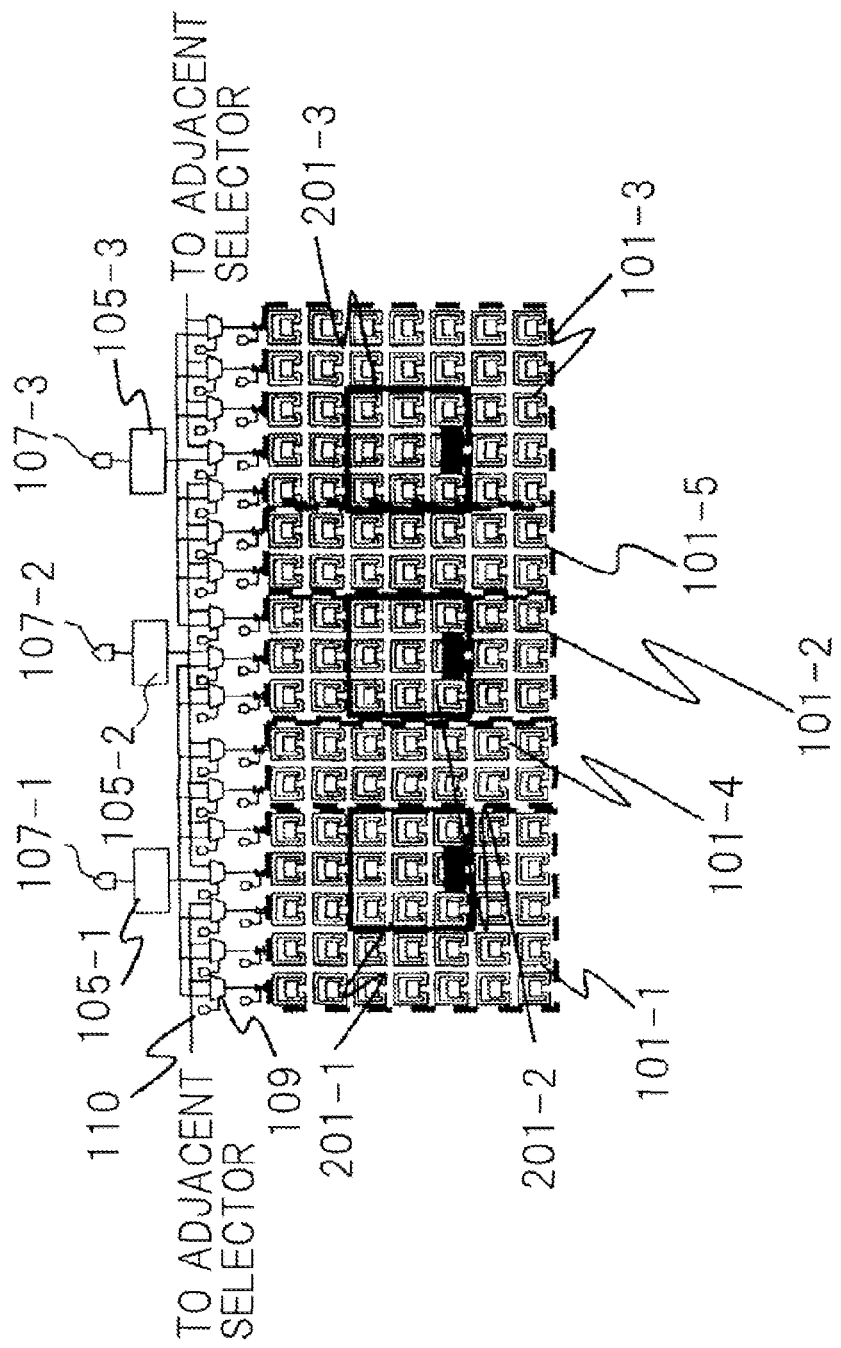
FIG. 12 is a block diagram of a semiconductor device in which reception coils and signal receivers are shared in a time division fashion.

FIG. 12 is a block diagram of a semiconductor device in which reception coils and signal receivers are shared in a time division fashion. FIG. 12 shows transmission and reception coil pairs having receiving sections similar in structure to the receiving sections of the transmission and reception coil pairs shown in FIG. 11. In FIG. 12, readers 104 are partly omitted from illustration. Transmission coils are shown as being projected to clearly indicate the relative positions of the transmission coils and the reception coils.

Transmission coil 201-1 and transmission coil 201-3 transmit signals in time region T1. Then, reception coil groups 101-1, 101-4 and signal receiver groups which correspond to transmission coil 201-1 operate, and reception coil groups 101-3, 101-5 and signal receiver groups which correspond to transmission coil 201-3 operate, thereby receiving the signals transmitted from transmission coils 201-1, 201-3. The signals that are read by readers 104 are sent through selectors 109 to corresponding arithmetic devices 105-1, 105-3, which process the signals into reception data 107-1, 107-3. In time region T2 after time region T1, transmission coil 201-2 transmits transmission data. At this time, selection signals 110 are changed to connect readers 104 to arithmetic device 105-2 thereby sending data produced by reception coil groups 101-2, 101-4, 104-5 and signal receiver groups to arithmetic device 105-2. Thereafter, arithmetic device 105-2 processes the data in the same manner as with arithmetic devices 105-1, 105-3, producing reception data 107-2. Time region T1 and time region T2 are alternately repeated to share the reception coils and the signal receivers. While the reception coils and the signal receivers are shown as being shared by two reception mechanisms, they are not limited to being shared by two reception mechanisms, but may be shared by more reception mechanisms by increasing the input ports of the selectors.

According to the present exemplary embodiment, as described above, one or more transmission and reception coil pairs each comprising a single transmission coil and a plurality of reception coils are provided. The arithmetic device, which is controllable after being mounted on a chip, processes data to cancel out the difference between the polarities of reception signals flowing through the reception coils, which is caused depending on whether the reception coils are positioned inside of the transmission coil or outside of the transmission coil, and thereby receives the transmission data.

2nd Exemplary Embodiment

Figure 13:
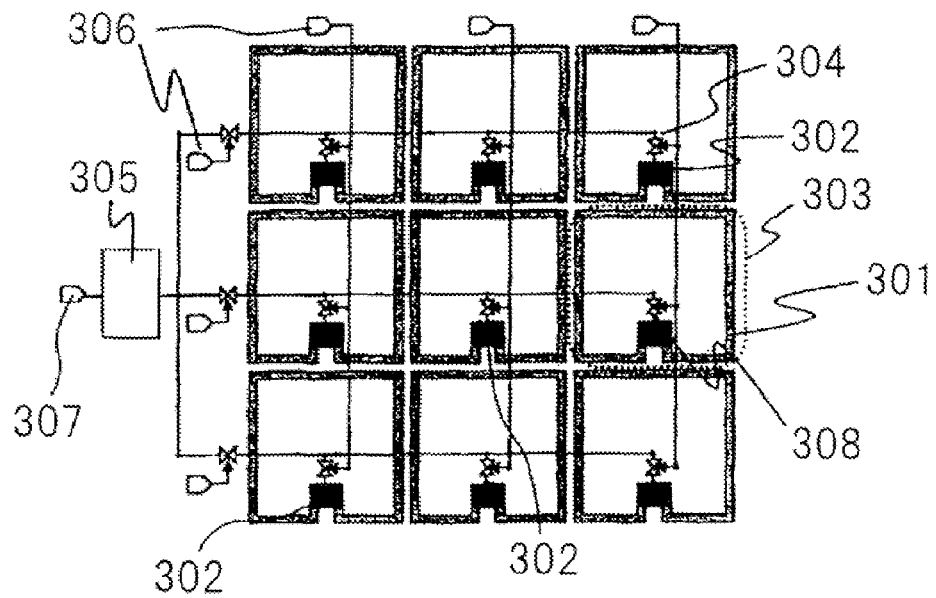
FIG. 13 is a block diagram of a transmitting section of a semiconductor device according to a second exemplary embodiment of the present invention.

FIG. 13 is a block diagram of a transmitting section of a semiconductor device according to a second exemplary embodiment of the present invention, i.e., a semiconductor device having a transmission and reception coil pair comprising a plurality of transmission coils and a single reception coil. The second exemplary embodiment is essentially the same as the first exemplary embodiment, and has an arrangement wherein the transmitting section and the receiving section according to the first exemplary embodiment are switched around.

The transmitting section according to the present exemplary embodiment includes a plurality of transmission mechanisms 303 in an array of three rows×three columns, each of transmission mechanisms 303 comprising transmission coil 301 and signal transmitter 302. Transmission signals are input from transmission signal generator 305 to signal transmitters 302 through writers 304 that are controlled by write control signals 306. Signal transmitters 302 supply currents to transmission coils 301 to transmit the transmission signals. It is assumed that signal transmitter 302 at the mth×nth location in FIG. 13 is referred to as T(m,n) and input signal 308 supplied to T(m,n) is referred to as D(m,n) where m represents an mth row and n represents an nth column, each of m, n being an integer of 0 or greater than 0.

In FIG. 13, transmission mechanisms 303 are arranged in a 3×3 array. However, transmission mechanisms 303 are not required to be in a 3×3 array, but may be in any array insofar as they are plural.

Figure 14:
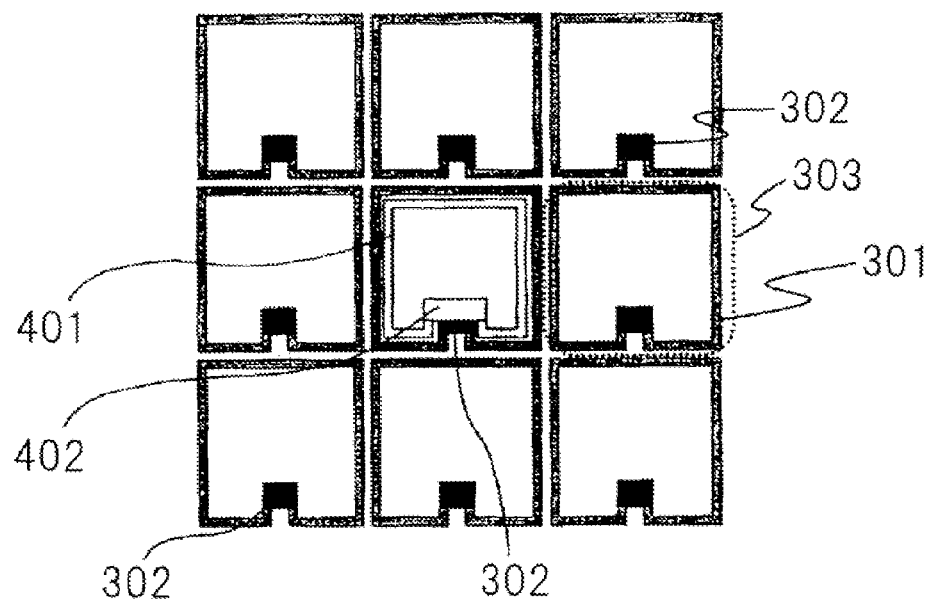
FIG. 14 is a schematic plan view which is clearly indicative of the relative positional relationship between transmission coils and reception coils according to the second exemplary embodiment.

FIG. 14 is a schematic plan view which is clearly indicative of the relative positional relationship between reception coil 401 and transmission coils 301. In FIG. 14, reception coil 401 mounted on a chip is projected onto a chip on which transmission coils 301 are disposed.

Operation of the semiconductor device at the time when currents are supplied to transmission coils 301 for signal transmission will be described below. It is assumed that a current which flows clockwise in the drawings as viewed from above is represented by "1", and that a current which flows counterclockwise is represented by "−1".

The signal transmission according to the present invention is based on an electromagnetic induction wherein reception coil 401 generates an induced current when magnetic fluxes generated by currents flowing through transmission coils 301 pass through reception coil 401. Therefore, the signal transmission is made efficient by uniformly orienting the directions of the magnetic fluxes generated by transmission coils 301. The magnetic fluxes generated by transmission coils 301 include magnetic fluxes inside of transmission coils 301 and magnetic fluxes outside of transmission coils 301, and the magnetic fluxes inside of transmission coils 301 and the magnetic fluxes outside of transmission coils 301 are oriented in opposite directions. The magnetic fluxes generated by transmission coil 301 disposed directly above reception coil 401, and the magnetic fluxes generated by transmission coils 301 disposed outside of reception coil 401 are oriented in opposite directions. For uniformly orienting the directions of the magnetic fluxes, a current supplied to transmission coil 301 disposed directly above reception coil 401 and currents supplied to transmission coils 301 disposed outside of reception coil 401 may be oriented in opposite directions for better efficiency.

Operation of the semiconductor device at the time when currents are caused to flow through transmission coils 301 for signal transmission will be described below.

Figure 15:
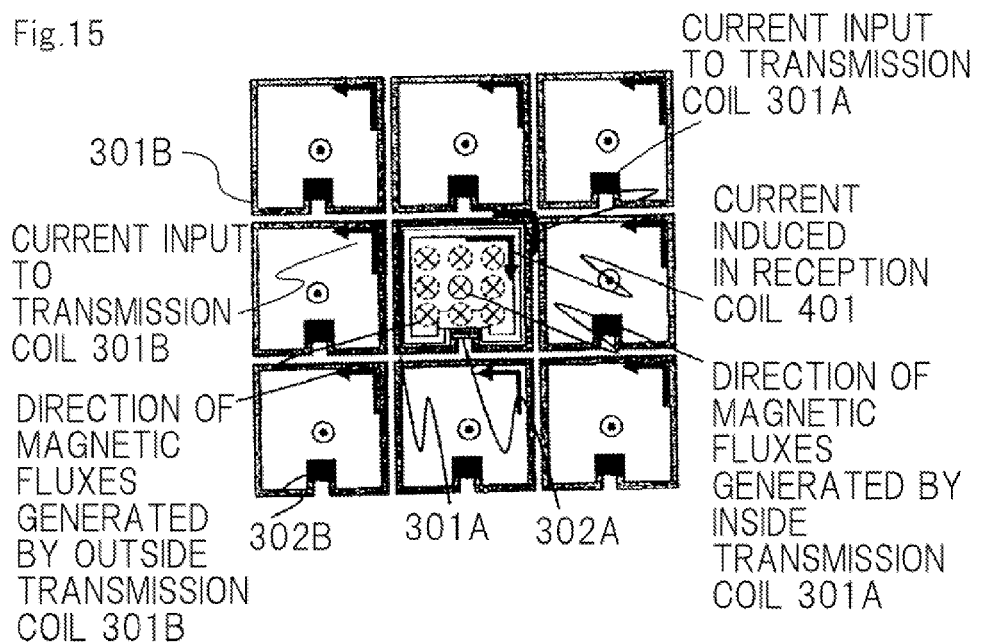
FIG. 15 is a diagram showing the manner in which the second exemplary embodiment operates when transmission data are "1"

First, a mode of operation in which transmission data are "1" will be described below with reference to FIG. 15.

Signal transmitter 302A(T(1,1)) disposed directly above reception coil 401 and other signal transmitters 302B will separately be analyzed below. Signal transmitter 302A(T(1,1)) is supplied with a signal for causing a current to flow clockwise through transmission coil 301A. Transmission coil 301A generates magnetic fluxes passing inside of reception coil 401 in a direction away from the viewer of FIG. 15, electromagnetically inducing a current flowing clockwise through reception coil 401. Signal transmitters 302B are supplied with signals for causing currents to flow counterclockwise through transmission coils 301B. Transmission coils 301B generate magnetic fluxes passing inside thereof in a direction toward the viewer of FIG. 15, and also generate magnetic fluxes passing inside of reception coil 401 in the same direction as the magnetic fluxes generated by signal transmitter 302A(T(1,1)), intensifying the magnetic fluxes generated by signal transmitter 302A(T(1,1)). The induced current generated by reception coil 401 is also intensified and flows clockwise. The induced current is received by signal receiver 402, whereupon the transmission data of "1" are transmitted.

Figure 16:
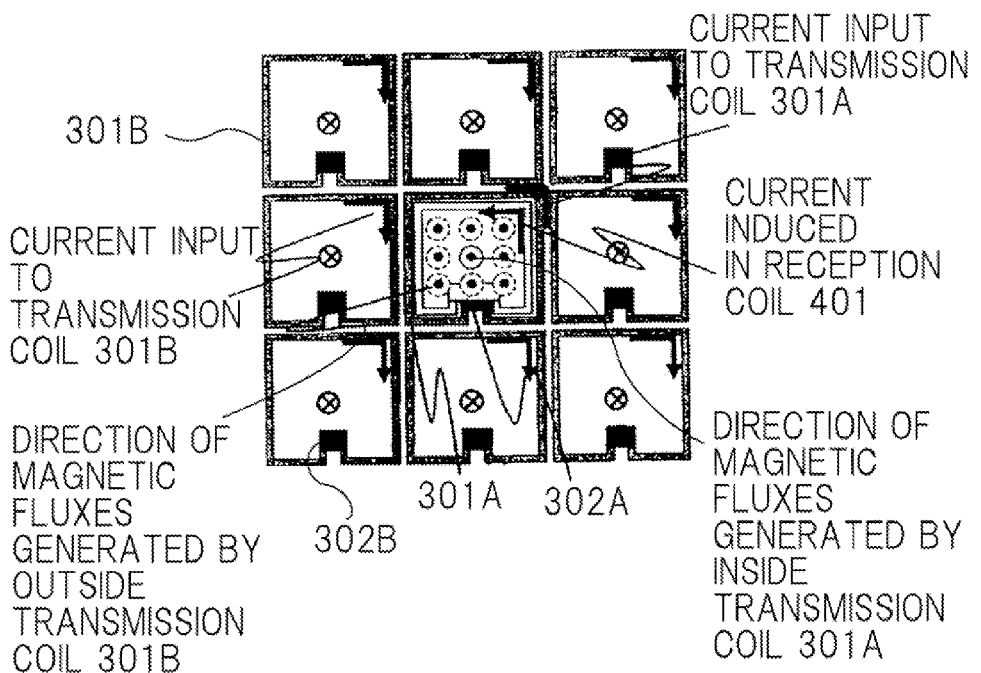
FIG. 16 is a diagram showing the manner in which the second exemplary embodiment operates when transmission data are "0"

When transmission data are "0", as shown in FIG. 16, signal transmitter 302A(T(1,1)) inputs a current flowing counterclockwise through transmission coil 301A, and the signal transmitters other than signal transmitter 302A(T(1,1)) input currents flowing clockwise through transmission coils 301B. The transmission coils with the currents flowing therethrough generate magnetic fluxes passing inside of reception coil 401 in a direction toward the viewer of FIG. 16, electromagnetically inducing a current flowing counterclockwise through reception coil 401. The current thus flowing counterclockwise is observed by signal receiver 402, whereupon the transmission data of "0" are transmitted.

If certain transmission coil 301 is displaced out of position as is the case with the first exemplary embodiment and if the magnetic fluxes that are generated by displaced transmission coil 301 act to weaken the magnetic fluxes passing through reception coil 401, then transmission coil 301 is supplied with either a reversed signal or no signal. In this manner, the magnetic fluxes are not weakened and a large induced current is generated for signal transmission.

Since more intensive magnetic fluxes are generated as passing through reception coil 401 than if signal transmission is performed only by transmission coil 301 disposed directly above reception coil 401, positional displacements of transmission and reception coils, as they are mounted, are accommodated for high-quality signal transmission.

As with the example of the first exemplary embodiment shown in FIG. 11, it is possible to mount a plurality of transmission and reception coil pairs according to the present exemplary embodiment. As with the example of the first exemplary embodiment shown in FIG. 8, it is also possible to share the transmission coils and the signal transmitters in a time division fashion.

In the present exemplary embodiment, one or more transmission and reception coil pairs each comprising a plurality of transmission coils and a single reception coil are provided, and the signal transmitters input currents to the transmission coils for intensifying magnetic fluxes passing through the reception coil for thereby transmitting the signal.

3rd Exemplary Embodiment

Figure 17:
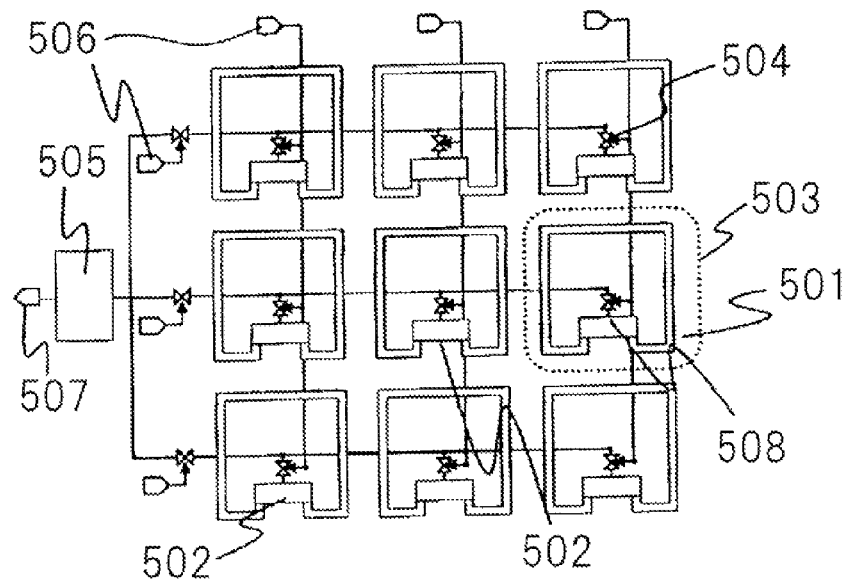
FIG. 17 is a block diagram of a receiving section of a semiconductor device according to a third exemplary embodiment of the present invention.
Figure 18:
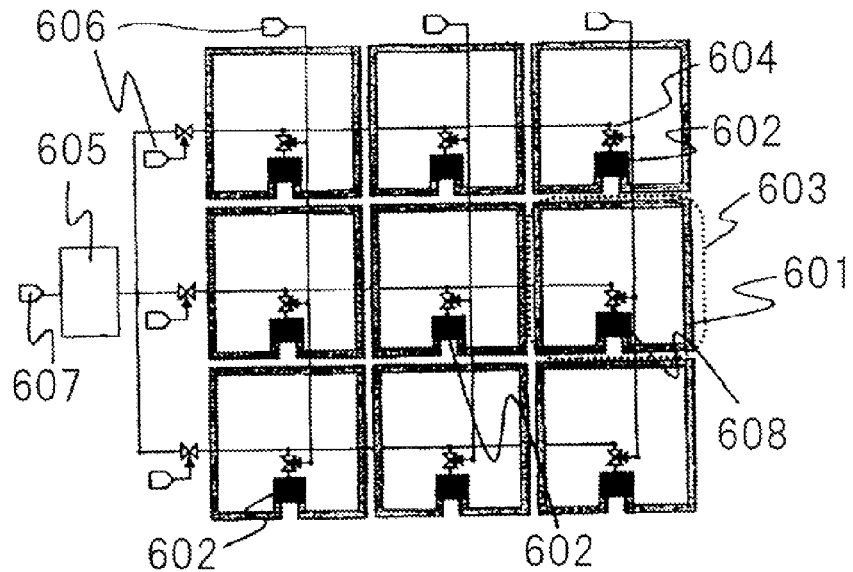
FIG. 18 is a block diagram of a transmitting section of the semiconductor device according to the third exemplary embodiment of the present invention.
Figure 19:
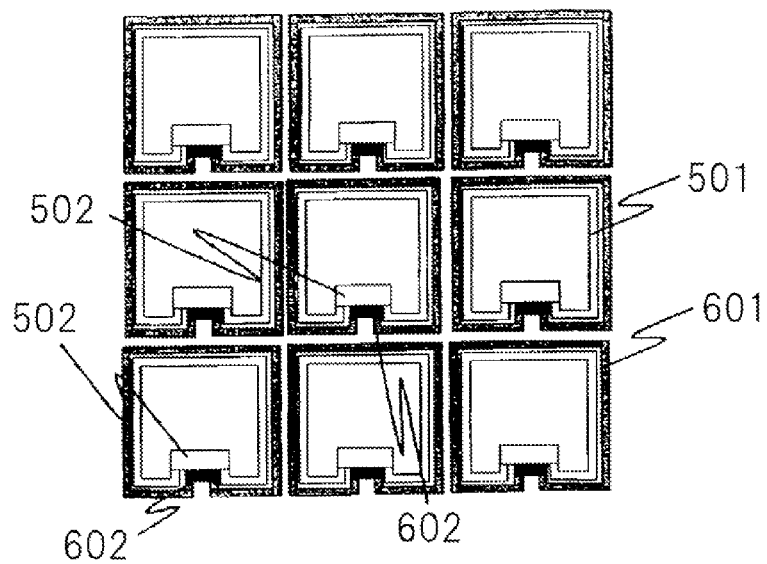
FIG. 19 is a projection diagram showing the relative positions of the transmitting and receiving sections according to the third exemplary embodiment.

FIG. 17 is a block diagram of a receiving section of a semiconductor device according to a third exemplary embodiment of the present invention, i.e., a semiconductor device having a transmission and reception coil pair comprising a plurality of transmission coils and a plurality of reception coils. FIG. 18 is a block diagram of a transmitting section of the semiconductor device according to the third exemplary embodiment of the present invention. The transmitting section according to the third exemplary embodiment is the same as the transmitting section according to the second exemplary embodiment. FIG. 19 is a projection diagram showing the relative positions of the transmitting and receiving sections according to the third exemplary embodiment.

Operation of the semiconductor device at the time when currents are caused to flow through transmission coils for signal transmission will be described below.

Figure 20:
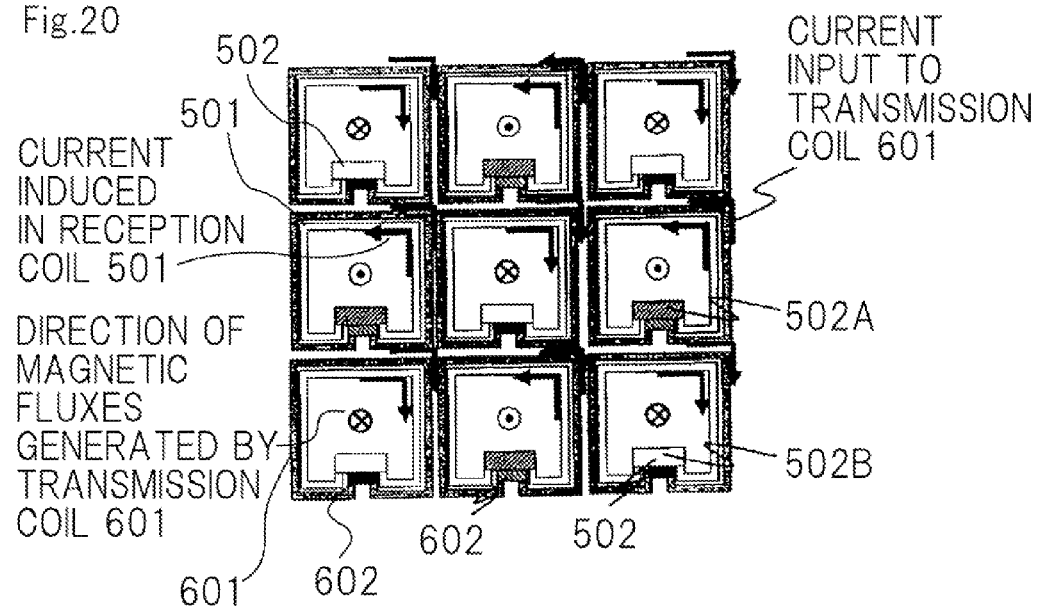
FIG. 20 is a diagram showing the manner in which the third exemplary embodiment operates when transmission data are "1"

First, a mode of operation in which transmission data are "1" will be described below with reference to FIG. 20. Signal transmitters T(m,n) where both m, n represent odd numbers or where even numbers cause currents to flow clockwise, and signal transmitters T(m,n) where m represents an even number and n an odd number or m represents an odd number and n an even number cause currents to flow counterclockwise. At this time, transmission coils 601 corresponding to the former signal transmitters generate magnetic fluxes passing inside of reception coil 501 corresponding to those transmission coils 601 in a direction away from the viewer of FIG. 20, and transmission coils 601 corresponding to the latter signal transmitters generate magnetic fluxes passing inside of reception coil 501 corresponding to those transmission coils 601 in a direction toward the viewer of FIG. 20. The magnetic fluxes passing through reception coils 501 intensify each other. At this time, reception coils 501 generate induced currents depending on the direction of the magnetic fluxes, and signal receivers 502 connected to respective reception coils 501 recover the signal. Signal transmitters R(m,n) where both m, n represent odd numbers or even numbers receive "1", and signal receivers R(m,n) where m represents an even number and n an odd number or where m represents an odd number and n an even number receive "−1". Thereafter, the received signals are sent through readers 504 to arithmetic device 505. Arithmetic device 505 invert and then add the signal sent from latter signal receivers R(m,n). Since the sum has a positive value, the transmission data are judged as being "1", whereupon the signal transmission is performed.

A mode of operation in which transmission data are "0" will be described below with reference to FIG. 21. When the transmission data are "0", currents in a direction opposite to the direction of currents when the transmission data are "1" are input to respective transmission coils 601. As a result, the direction of the generated magnetic fluxes and the generated induced currents is reversed, and the polarity of the received signals is also reversed. The sum produced by arithmetic device 505 has a negative value, and the transmission data are judged as being "1", whereupon signal transmission is performed.

If positional displacements occur, or if offsets due to variations and disturbances are caused, their effects can be removed for high-quality signal transmission by changing the processing process of the arithmetic device of the receiving section and the signals generated by the signal generator after the transmitting and receiving sections are mounted on the chips.

As with the example of the first exemplary embodiment shown in FIG. 11, it is possible to mount a plurality of transmission and reception coil pairs according to the present exemplary embodiment. As with the example of the first exemplary embodiment shown in FIG. 12, it is also possible to share the transmission coils and the signal transmitters and to share the reception coils and the signal receivers in a time division fashion.

In the present exemplary embodiment, as described above, one or more transmission and reception coil pairs each comprising a plurality of transmission coils and a plurality of reception coils are provided, and the signal transmitters input currents to the transmission coils for intensifying magnetic fluxes passing through the reception coils. In the reception mechanisms, the arithmetic device processes data to cancel out the difference between the polarities of signals generated by the reception coils, whereupon the signal is transmitted.

Although the preferred exemplary embodiments have been described above using specific terminology, it should be understood that the description is by way of example only, and various changes and modifications can be made without departing from the scope of claims for patent to be described below.

The invention claimed is:

1. A semiconductor device for transmitting a signal through an inductive coupling, comprising:
   one or more transmission and reception coil pair, each pair comprising a transmission coil and a plurality of reception coils, and a diameter of each reception coil being smaller than a diameter of said transmission coil;
   a plurality of signal receivers for receiving signals generated by said plurality of reception coils, respectively; and
   an arithmetic device for performing an arithmetical operation on output signals from said plurality of signal receivers and outputting a signal transmission result,
   wherein said plurality of reception coils are arranged in an array of rows and columns, and said plurality of reception coils consist of a plurality of first reception coils which are located inside of said transmission coil and a plurality of second reception coils which are located outside of said transmission coil,
   when a current flows in said transmission coil, a current flows through said plurality of first reception coils in a direction which is the same as the current flowing through said transmission coil and a current flows through said plurality of second reception coils in a direction which is opposite to the current flowing through said transmission coil, and
   said arithmetic device generates said signal transmission result based on output results of said plurality of signal receivers.

2. The semiconductor device according to claim 1, wherein said arithmetic device has processing contents arbitrarily controllable after being mounted on a chip.

3. The semiconductor device according to claim 1, wherein said signal receivers have amplification factors or threshold values arbitrarily controllable after being mounted on a chip.

4. A semiconductor device for transmitting a signal through an inductive coupling, comprising:
   one or more transmission and reception coil pair, each pair comprising a plurality of transmission coils and a reception coil;
   a plurality of signal transmitters for causing current to flow in said plurality of transmission coils, respectively; and
   a signal receiver for receiving a signal generated by said reception coil,
   wherein the degree to which respective transmission signals of said plurality of signal transmitters contribute to a signal transmission result is arbitrarily controllable,
   said plurality of transmission coils are arranged in an array of rows and columns, and said plurality of transmission coils consist of a first transmission coil and a plurality of second transmission coils which are located outside of said first transmission coil,
   said first transmission coil is located close to and corresponds to said reception coil, and
   when a signal transmitter which corresponds to said first transmission coil, supplies a current to said first transmission coil, signal transmitters which correspond to said plurality of second transmission coils, supply currents to said plurality of second transmission coils in a direction opposite to the current flowing through said first transmission coil.

5. The semiconductor device according to claim 4, further comprising:
   a transmission signal generator for inputting signals to said signal transmitters, respectively, said transmission signal generator being arbitrarily controllable in operation after being mounted on a chip.

6. A semiconductor device for transmitting a signal through an inductive coupling, comprising:
   one or more transmission and reception coil pair, each pair comprising a plurality of transmission coils and a plurality of reception coils;
   a plurality of signal receivers for receiving signals generated by said plurality of reception coils, respectively; and
   a plurality of signal transmitters for causing currents to flow in said a plurality of transmission coils, respectively,
   wherein the degree to which either one or both of transmission signals of said a plurality of signal transmitters and output results of said a plurality of signal receivers contribute to a signal transmission result is arbitrarily controllable,
   said plurality of transmission coils and said plurality of reception coils are arranged in an array of rows and columns, respectively,
   each of said plurality of signal transmitters determines a direction of current flowing through a transmission coil thereof according to a case in which a number of said columns and a number of said rows are odd numbers or even numbers, or a case in which one of the number of said columns and the number of said rows is an odd number and the other is an even number.

7. The semiconductor device according to claim 6, further comprising:
- an arithmetic device for being supplied with output results of said signal receivers; and
- a transmission signal generator for inputting signals to said signal transmitters, respectively,
- wherein said arithmetic device has processing contents arbitrarily controllable after being mounted on a chip, and said transmission signal generator is arbitrarily controllable in operation after being mounted on a chip.

* * * * *